(12) United States Patent
Liu

(10) Patent No.: US 11,961,737 B2
(45) Date of Patent: Apr. 16, 2024

(54) SEMICONDUCTOR STRUCTURE AND MANUFACTURING METHOD

(71) Applicants: Semiconductor Manufacturing International (Shanghai) Corporation, Shanghai (CN); Semiconductor Manufacturing International (Beijing) Corporation, Beijing (CN)

(72) Inventor: Zhenyu Liu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 140 days.

(21) Appl. No.: 17/447,861

(22) Filed: Sep. 16, 2021

(65) Prior Publication Data

US 2022/0093398 A1   Mar. 24, 2022

(30) Foreign Application Priority Data

Sep. 21, 2020   (CN) .................... 202010996460.X

(51) Int. Cl.
*H01L 21/02* (2006.01)
*H01L 29/08* (2006.01)
*H01L 29/66* (2006.01)
*H01L 29/78* (2006.01)

(52) U.S. Cl.
CPC .... *H01L 21/02645* (2013.01); *H01L 21/0262* (2013.01); *H01L 29/0847* (2013.01); *H01L 29/66795* (2013.01); *H01L 29/7848* (2013.01); *H01L 29/7851* (2013.01)

(58) Field of Classification Search
CPC .......... H01L 21/02645; H01L 21/0262; H01L 21/0245; H01L 21/02532; H01L 21/02576; H01L 21/02639; H01L 29/0847; H01L 29/66795; H01L 29/7848; H01L 29/7851; H01L 29/165; H01L 29/785; H01L 29/41775; H01L 29/41791
See application file for complete search history.

(56) References Cited

U.S. PATENT DOCUMENTS

| 2018/0337280 | A1* | 11/2018 | Zhao | H01L 29/456 |
| 2019/0097006 | A1* | 3/2019 | Li | H01L 29/66795 |
| 2021/0036145 | A1* | 2/2021 | Lin | H01L 29/66795 |

* cited by examiner

*Primary Examiner* — Farun Lu
*Assistant Examiner* — Sandra Milena Rodriguez Villanu
(74) *Attorney, Agent, or Firm* — Anova Law Group, PLLC

(57) ABSTRACT

A semiconductor structure includes a substrate including a base and a plurality of fins discretely formed over the base. Each fin is made of a material including a first atom and contains openings therein. The semiconductor structure also includes a source-drain doped layer located in each opening and including a seed layer on a surface of an inner wall of the opening and a body layer on a surface of the seed layer. A material of the seed layer includes the first atom, a second atom, and a third atom. A material of the body layer includes the first atom and the second atom.

17 Claims, 7 Drawing Sheets

SEMICONDUCTOR STRUCTURE AND MANUFACTURING METHOD

CROSS-REFERENCE TO RELATED APPLICATION

This application claims priority to Chinese Patent Application No. 202010996460.X, filed Sep. 21, 2020, the entire content of which is incorporated herein by reference.

TECHNICAL FIELD

The present disclosure relates to the field of semiconductor manufacturing and, in particular, to a semiconductor structure and a manufacturing method.

BACKGROUND

With a rapid development of integrated circuit manufacturing technology, a size of semiconductor devices in an integrated circuit is continuously reduced, in order to effectively improve an operating speed of the entire integrated circuit.

In very large-scale integrated circuits, stress is usually formed on a transistor to increase a carrier mobility of the transistor, and to increase a driving current of the transistor.

However, the performance and reliability of semiconductor devices manufactured by the existing technology still need to be improved.

SUMMARY

A technical problem solved by the present disclosure is to provide a semiconductor structure and a manufacturing method thereof to improve the performance and reliability of a fin-type field effect transistor.

To solve the above technical problem, the technical solution of the present disclosure provides a semiconductor structure including a substrate and a source-drain doped layer. The substrate includes a base and a plurality of fins discretely formed over the base, each fin is made of a material including a first atom and contains openings therein. The source-drain doped layer is located in each opening and includes a seed layer on a surface of an inner wall of the opening, and a body layer on a surface of the seed layer. A material of the seed layer includes the first atom, a second atom, and a third atom. A material of the body layer includes the first atom and the second atom.

Optionally, the first atom includes a silicon atom, and the second atom includes a phosphorus atom.

Optionally, the third atom includes a germanium atom.

Optionally, a concentration percentage of the third atom in the seed layer is less than a concentration percentage of the first atom in the seed layer, and is less than a concentration percentage of the second atom in the seed layer.

Optionally, a concentration percentage of the second atom in the body layer is greater than the concentration percentage of the second atom in the seed layer.

Optionally, a concentration percentage of the germanium atom ranges from 5% to 10%.

Optionally, a thickness of the seed layer ranges from 2 nanometers to 8 nanometers from the surface of the inner wall of the opening.

Optionally, a maximum width of the source-drain doped layer is 45 nanometers in a direction perpendicular to an extending direction of the plurality of fins.

Optionally, a maximum height of the source-drain doped layer is 60 nanometers.

Optionally, the semiconductor structure further includes a gate structure located over a surface of the substrate, across the plurality of fins. The openings are located in each fin on both sides of the gate structure.

Correspondingly, the technical solution of the present disclosure also provides a manufacturing method of the above semiconductor structure including providing a substrate including a base and a plurality of fins discretely formed over the base, forming openings in each fin of the plurality of fins, and forming a source-drain doped layer in each opening using an epitaxial growth process. Each fin is made of a material including a first atom. The source-drain doped layer includes a seed layer on a surface of an inner wall of the opening, and a body layer on a surface of the seed layer. A material of the seed layer includes the first atom, a second atom, and a third atom. A material of the body layer includes the first atom and the second atom.

Optionally, the first atom includes a silicon atom, and the second atom includes a phosphorus atom.

Optionally, the third atom includes a germanium atom.

Optionally, a concentration percentage of the germanium atom ranges from 5% to 10%.

Optionally, a concentration percentage of the third atom in the seed layer is less than a concentration percentage of the first atom in the seed layer, and is less than a concentration percentage of the second atom in the seed layer.

Optionally, a concentration percentage of the second atom in the body layer is greater than the concentration percentage of the second atom in the seed layer.

Optionally, the seed layer is formed using a selective epitaxial growth process. A parameter of the selective epitaxial growth process for forming the seed layer includes gases used for forming the seed layer include a silicon source gas, a phosphorus source gas, and a germanium source gas.

Optionally, the parameter of the selective epitaxial growth process for forming the seed layer further includes a temperature range of 650° C. to 750° C., a pressure range of 100 Torr to 300 Torr, and the gases used for forming the seed layer further include a hydrogen chloride gas and a hydrogen gas.

Optionally, the body layer is formed using the selective epitaxial growth process. A parameter of the selective epitaxial growth process for forming the body layer includes gases used for forming the body layer include the phosphorus source gas and the silicon source gas.

Optionally, the parameter of the selective epitaxial growth process for forming the body layer further includes a temperature range of 600° C. to 700° C., a pressure range of 100 Torr to 600 Torr, and the gases used for forming the body layer further include the hydrogen chloride gas and the hydrogen gas.

Optionally, before forming the openings, the manufacturing method further includes forming a gate structure across the plurality of fins over a surface of the substrate. The method for forming the openings includes, after forming the gate structure, using the gate structure as a mask, etching the plurality of fins on both sides of the gate structure until the openings are formed in the plurality of fins on both sides of the gate structure.

Compared with the existing technology, the technical solution of the present disclosure provides the following beneficial effects.

In the manufacturing method for a semiconductor structure provided by the technical solution of the present disclosure, the second atom is used to increase the stress formed by the grown material, and the third atom is used to change the growth characteristics of the material. Thus, when the material is grown, according to the selected type of the third atom, the material may have a relatively slow growth rate at the crystal planes in some specific directions or the crystal planes approaching some directions, to enable the structure of the material to have a fixed crystal plane or approach to have a fixed crystal plane. The source-drain doped layer includes the seed layer located on the surface of the inner wall of the opening and the body layer located on the surface of the seed layer. The material of the seed layer includes the first atom, the second atom, and the third atom. The material of the body layer includes the first atom and the second atom. Therefore, while increasing the stress formed by the source-drain doped layer, the morphology of the source-drain doped layer can be easily controlled, to cause the gap between morphology of each source-drain doped layer to be small, thereby improving the performance and reliability of the semiconductor structure. Specifically, because the seed layer includes the first atom and the second atom, the body layer can be formed through the seed layer to include the first atom and the second atom, thereby improving the stress formed by the source-drain doped layer through the second atom. At the same time, because the seed layer also includes the third atom, the body layer grown through the seed layer can have the same or similar growth characteristics as the seed layer. When the body layer is formed, the material of the body layer can have a relatively slow growth rate at the crystal planes in specific directions, or the crystal planes approaching some specific directions, to cause the morphology of the formed body layer to be easily controlled and to cause the difference between the morphology of the source-drain doped layer to be small.

Furthermore, the concentration percentage of the third atom in the seed layer is less than the concentration percentage of the first atom in the seed layer and is less than the concentration percentage of the second atom in the seed layer. Therefore, the body layer grown through the seed layer with the third atom can make the material have a relatively slow growth rate at the crystal planes in some specific directions, or the crystal planes approaching to some specific directions, to realize the control of the morphology of the body layer, reduce the influence of the electrical properties of the source-drain doped layer by the third atom, and better improve the performance and reliability of the semiconductor structure.

Furthermore, because the concentration percentage of the germanium atom ranges from 5% to 10%, by making the seed layer have a certain content of germanium atoms, the material of the body layer grown through the seed layer can have a relatively slow growth rate at the crystal plane in (111) direction of or at the crystal plane approaching to the (111) direction, to achieve the control of the morphology of the body layer. At the same time, by controlling the content of germanium atoms in the seed layer, the compressive stress generated by the germanium atoms can be controlled to reduce the influence of the compressive stress on the tensile stress generated by the phosphorus atom. Thereby, the difference between the morphology of each source-drain doped layer can be made to be small, the influence of germanium atoms at the electrical properties of the source-drain doped layer can be reduced, and the performance and reliability of the semiconductor structure can be better improved.

DETAILED DESCRIPTION OF THE EMBODIMENTS

As described in the background, the performance and reliability of existing fin-type field effect transistors still need to be improved. A detailed description will be given below with reference to the drawings.

Figure 1:
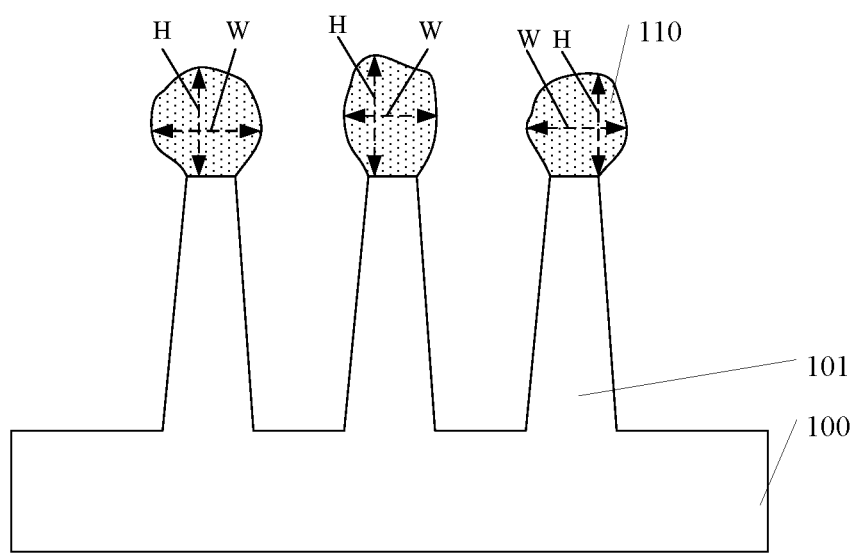
FIG. 1 is a schematic cross-sectional structural diagram of an example semiconductor structure.

FIG. 1 is a schematic cross-sectional structural diagram of an example semiconductor structure.

As shown in FIG. 1, the semiconductor structure includes a substrate 100, a plurality of fins 101 discretely formed over the substrate 100 and contains source-drain openings (not shown) in each fin 101, and a source-drain doped layer located in each source-drain opening 110. A material of the source-drain doped layer 110 is silicon phosphide (SiP).

The material of the source-drain doped layer 110 includes phosphorus atoms, a stress formed by the source-drain doped layer 110 in an N-type MOS tube device can be increased, thereby improving the performance of the semiconductor structure.

However, due to material growth characteristics of silicon phosphide, when the material of the source-drain doped layer 110 is grown using the epitaxial growth process, growth rates of the material of the source-drain doped layer 110 at crystal planes in all directions are close to each other. Therefore, it is difficult to control morphology of each source-drain doped layer 110 formed, resulting in poor consistency of the morphology of each source-drain doped layer 110, for example, a size difference in a maximum width W of each source-drain doped layer 110 (as shown in FIG. 1) and a size difference in a maximum height H of each source-drain doped layer 110 (as shown in FIG. 1) are relatively large, resulting in poor performance and reliability of the semiconductor structure.

To solve the above technical problem, a manufacturing method for a semiconductor structure consistent with the embodiments of the present disclosure is provided. The source-drain doped layer includes a seed layer on a surface of an inner wall of the opening and a body layer on a surface of the seed layer. A material of the seed layer includes a first atom, a second atom, and a third atom. A material of the body layer includes the first atom and the second atom. Thus, the stress formed by the source-drain doped layer can be increased while the morphology of the source-drain doped layer can be easily controlled, to cause a gap between the morphologies of the source-drain doped layer to be small, thereby improving the performance and reliability of the semiconductor structure.

To achieve the above objectives, features, and beneficial effects of the present disclosure more obvious and understandable, specific embodiments of the present disclosure will be described in detail below with reference to the drawings.

FIG. 2 to FIG. 8 are the schematic structural diagrams of processes of a manufacturing method for a semiconductor structure according to an example embodiment of the disclosure.

Figure 2:
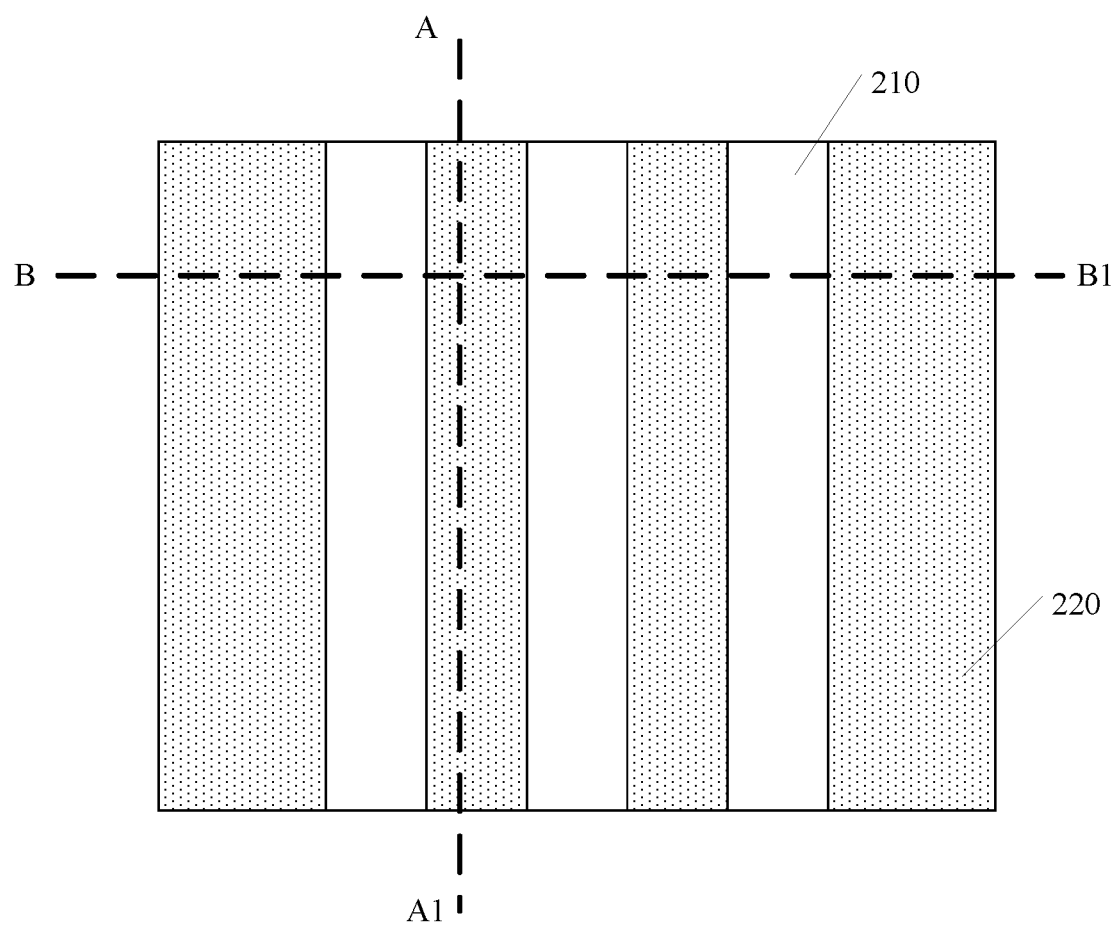
FIG. 2 to FIG. 8 are the schematic structural diagrams of processes of a manufacturing method for a semiconductor structure according to an example embodiment of the disclosure.
Figure 3:
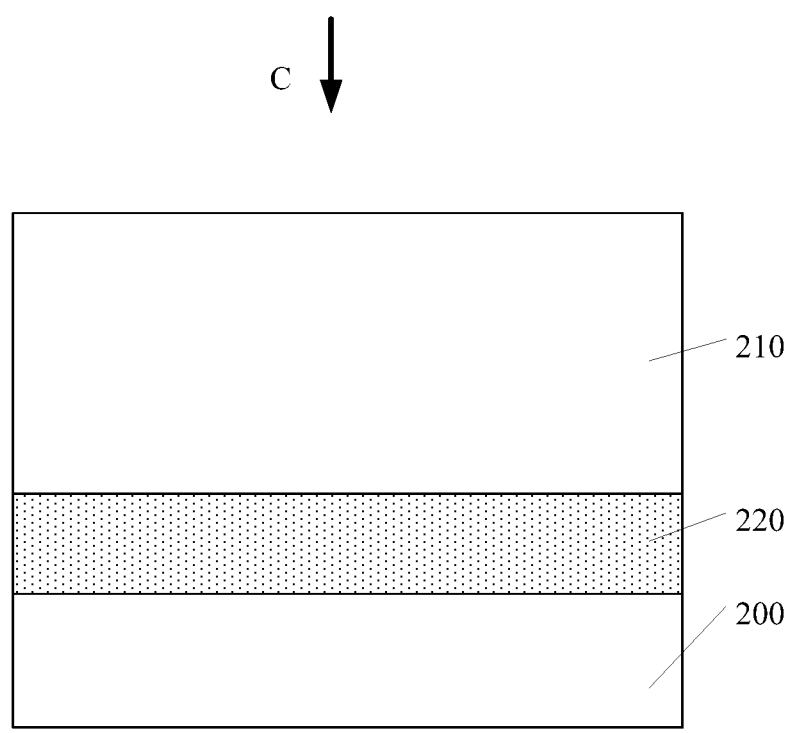
Figure 4:
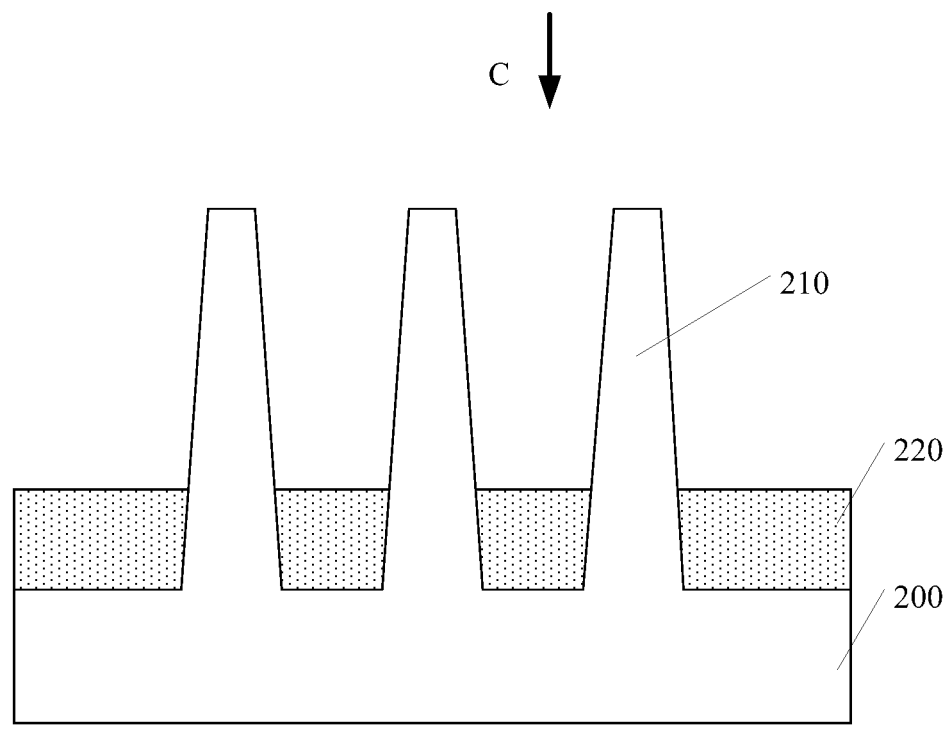

FIG. 2 is a schematic structural diagram of a top view of FIGS. 3 and 4 in direction C. FIG. 3 is a schematic cross-sectional structural diagram of FIG. 2 along the A-A1 direction. FIG. 4 is a schematic cross-sectional structural diagram of FIG. 2 along direction B-B1. As shown in FIGS.

2 to 4, the manufacturing method for a semiconductor structure includes providing a substrate. The substrate includes a base 200 and a plurality of fins 210 discretely formed over the base 200.

In an example embodiment, a material of the substrate 200 includes a semiconductor material.

In an example embodiment, the material of the substrate 200 is silicon. Correspondingly, a material of the fins 210 includes a first atom. The first atom includes a silicon atom.

In some embodiments, the material of the substrate includes silicon carbide, silicon germanium, a multi-element semiconductor material composed of group III-V elements, silicon-on-insulator (SOI), or germanium-on-insulator (GOI), etc. The multi-element semiconductor material composed of group III-V elements includes InP, GaAs, GaP, InAs, InSb, InGaAs, or InGaAsP.

In an example embodiment, the method for forming the fins 210 includes providing an initial substrate (not shown), forming a fin-patterned layer (not shown) on a surface of the initial substrate, using the fin-patterned layer as a mask and etching the initial substrate until the base 200 and the plurality of fins 210 are formed.

In an example embodiment, a process of etching the initial substrate includes at least one of a dry etching process or a wet etching process.

In an example embodiment, after the plurality of fins 210 are formed, the fin-patterned layer is removed.

In an example embodiment, before subsequently formed openings are formed, an isolation layer 220 is formed on the surface of the substrate 200. A top surface of the isolation layer 220 is lower than a top surface of each of the plurality of fins 210.

Then, the openings are formed in the fins 210. Please refer to FIGS. 5 and 6 for the specific process of forming the opening.

Figure 5:
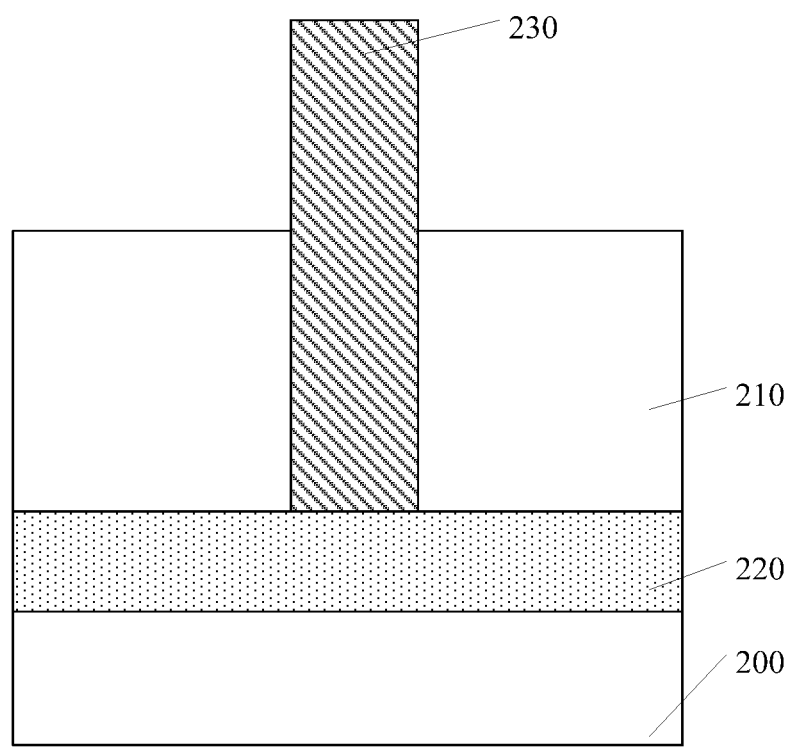

Please refer to FIG. 5. A view direction of FIG. 5 is the same as a view direction of FIG. 2. A gate structure 230 across the plurality of fins 210 is formed over the surface of the substrate.

In an example embodiment, because the isolation layer 220 is formed on the surface of the substrate 200, forming the gate structure 230 across the plurality of fins 210 over the surface of the substrate refers to forming the gate structure 230 across the plurality of fins 210 on the top surface of the isolation layer 220.

In an example embodiment, the gate structure 230 is a part of a subsequently formed MOS device.

In some embodiments, the gate structure is a dummy gate structure in a gate last process.

In an example embodiment, a type of the subsequently formed MOS device is an N-type MOS device.

In an example embodiment, the method of forming the gate structure 230 includes forming a gate structure material layer (not shown) covering the surface of the plurality of fins 210 on the surface of the substrate 200, patterning the gate structure material layer until the surface of the substrate 200 is exposed, forming the gate structure 230 across the plurality of fins 210 on the substrate 200. The top surface of the gate structure 230 is higher than the top surface of the plurality of fins 210.

In an example embodiment, the gate structure 230 can define a position of the subsequently formed opening.

Figure 6:
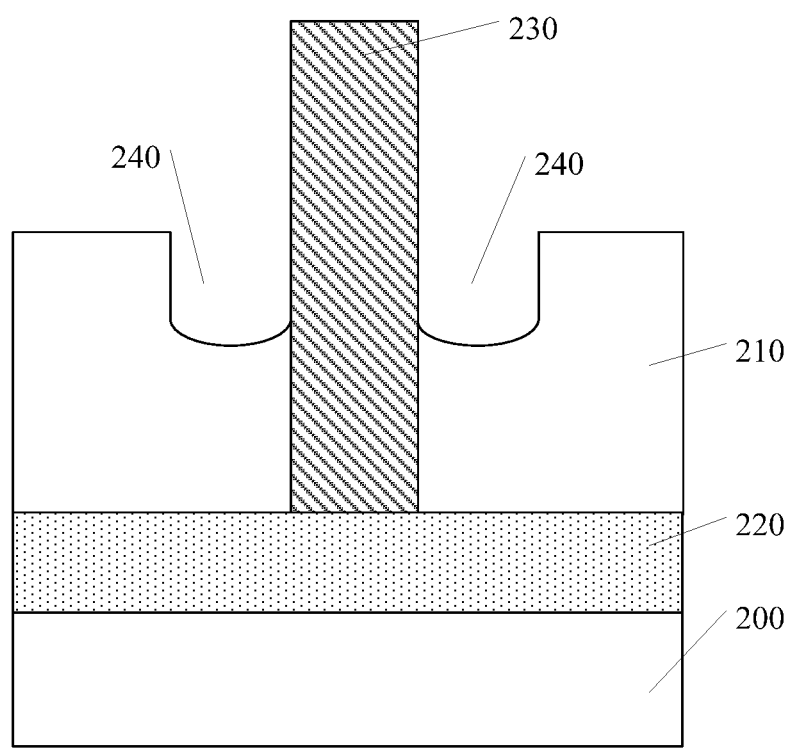

Please refer to FIG. 6. A view direction of FIG. 6 is the same as the view direction of FIG. 2. After the gate structure 230 is formed, the gate structure 230 is used as a mask, both sides of each fin 210 are etched until the openings 240 are formed in each fin 210 on both sides of the gate structure 230.

In an example embodiment, the process of etching the plurality of fins 210 includes at least one of the dry etching process or the wet etching process.

The opening 240 provides a space for forming the source-drain doped layer.

Figure 7:
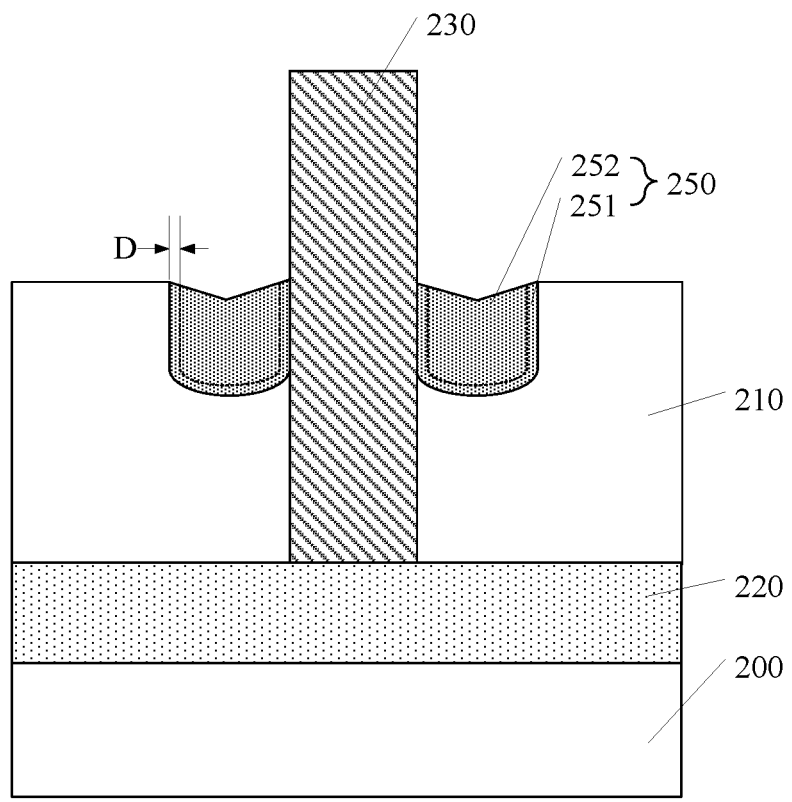
Figure 8:
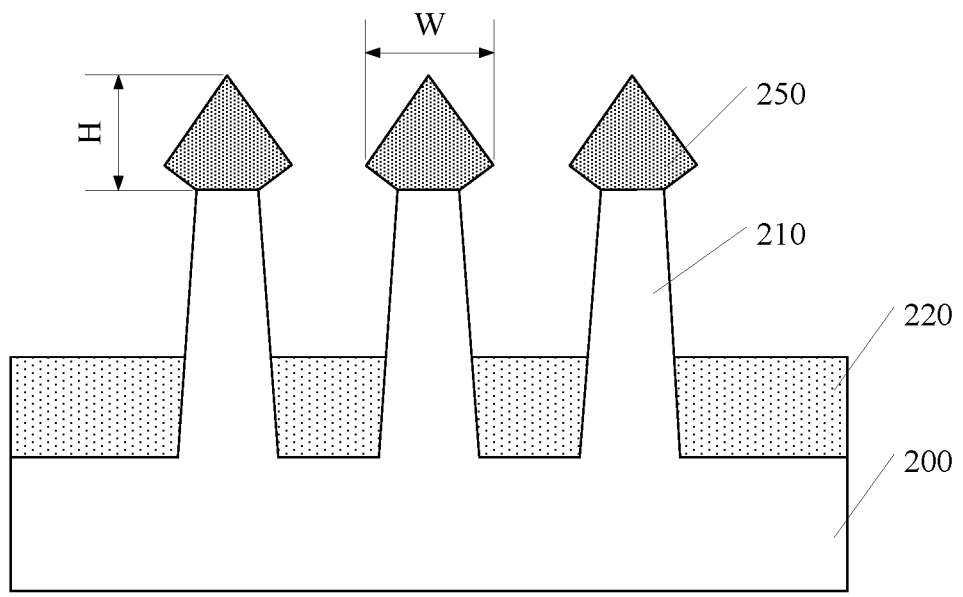

Please refer to FIG. 7 and FIG. 8. A view direction of FIG. 7 is the same as the view direction of FIG. 2. A view direction of FIG. 8 is the same as a view direction of FIG. 3. The doped layer 250 includes a seed layer 251 on a surface of an inner wall of the opening 240 and a body layer 252 on a surface of the seed layer 251. A material of the seed layer 251 includes a first atom, a second atom, and a third atom. A material of the body layer 252 includes the first atom and the second atom.

The second atom is used to increase the stress formed by the grown material. The third atom is used to change the growth characteristics of the material. Thus, when the material is grown, according to the selected type of the third atom, the material may have a relatively slow growth rate at the crystal planes in some specific directions or the crystal planes approaching some directions, to enable the structure of the material to have a fixed crystal plane or approach to have a fixed crystal plane.

The source-drain doped layer 250 includes the seed layer 251 located on the surface of the inner wall of the opening 240 and the body layer 252 located on the surface of the seed layer 251. The material of the seed layer 251 includes the first atom, the second atom, and the third atom. The material of the body layer 252 includes the first atom and the second atom. Therefore, while increasing the stress formed by the source-drain doped layer 250, the morphology of the source-drain doped layer 250 can be easily controlled to cause the gap between morphology of each source-drain doped layer to be small, thereby improving the performance and reliability of the semiconductor structure.

Specifically, because the seed layer 251 includes the first atom and the second atom, the body layer 252 can be formed through the seed layer 251 to include the first atom and the second atom, thereby improving the stress formed by the source-drain doped layer 250 through the second atom. At the same time, because the seed layer 251 also includes the third atom, the body layer 252 grown through the seed layer 251 can have the same or similar growth characteristics as the seed layer 251. When the body layer 252 is formed, the material of the body layer 252 can have a relatively slow growth rate at the crystal planes in specific directions, or the crystal planes approaching some specific directions, to cause the morphology of the formed body layer 252 to be easily controlled and to cause the difference between the morphology of the source-drain doped layer 250 to be small.

In an example embodiment, a concentration percentage of the third atom in the seed layer 251 is less than a concentration percentage of the first atom in the seed layer 251 and is less than a concentration percentage of the second atom in the seed layer 251.

Because the concentration percentage of the third atom in the seed layer 251 is less than the concentration percentage of the first atom in the seed layer 251 and is less than the concentration percentage of the second atom in the seed layer 251, the body layer 252 grown through the seed layer 251 with the third atom can make the material of the body layer 252 have a relatively slow growth rate at the crystal planes in some specific directions, or the crystal planes approaching to some specific directions, to realize the control of the morphology of the body layer 252, reduce the influence of the electrical properties of the source-drain doped layer 250 by the third atom, and better improve the performance and reliability of the semiconductor structure.

In an example embodiment, the second atom includes a phosphorus atom. Thus, an N-type MOS tube device can be formed.

In an example embodiment, the third atom includes a germanium atom.

In some embodiments, another type of the first atom, the second atom, or the third atom can also be selected, to enable the source-drain doped layer to be used to form a P-type MOS device.

In an example embodiment, a concentration percentage of the germanium atom in the seed layer 251 ranges from 5% to 10%.

Because the concentration percentage of the germanium atom ranges from 5% to 10%, by making the seed layer 251 have a certain content of germanium atoms, the material of the body layer 252 grown through the seed layer 251 can have a relatively slow growth rate at the crystal plane in (111) direction of or the crystal plane approaching to the (111) direction, to achieve the control of the morphology of the body layer 252. At the same time, by controlling the content of germanium atoms in the seed layer 251, the compressive stress generated by the germanium atoms can be controlled to reduce the influence of the compressive stress on the tensile stress generated by the phosphorus atom. Thereby, the difference between the morphology of each source-drain doped layer 250 can be made to be small, the influence of germanium atoms at the electrical properties of the source-drain doped layer 250 can be reduced, and the performance and reliability of the semiconductor structure can be better improved.

In an example embodiment, the seed layer 251 is formed using a selective epitaxial growth process.

In an example embodiment, a parameter of the selective epitaxial growth process for forming the seed layer 251 includes gases used for forming the seed layer 251 include a silicon source gas, a phosphorous source gas, and a germanium source gas.

Therefore, the formation of the seed layer 251 including the first atom, the second atom, and the third atom can be realized.

In an example embodiment, the parameter of the selective epitaxial growth process for forming the seed layer 251 further includes a temperature range of 650° C. to 750° C., a pressure range of 100 Torr to 300 Torr, and the gases used for forming the seed layer further include a hydrogen chloride gas and a hydrogen gas.

By selecting the process parameter, that is, selecting the temperature range, pressure range, and the gases used, the seed layer 251 can be formed and the material characteristics of the formed seed layer 251 can be controlled more accurately, thereby achieving better control of the morphology of the body layer 252.

In an example embodiment, a concentration percentage of the second atom in the body layer 252 is greater than the concentration percentage of the second atom in the seed layer 251. Therefore, the tensile stress generated by the phosphorus atoms can be further increased to increase the stress provided by the source-drain doped layer 250 and to improve the performance of the semiconductor structure.

In an example embodiment, the body layer 252 is formed using the selective epitaxial growth process.

In an example embodiment, a parameter of the selective epitaxial growth process for forming the body layer 252 includes gases used for forming the body layer 252 includes the phosphorus source gas and the silicon source gas.

Thereby, the formation of the body layer 252 including the first atom and the second atom can be realized.

In an example embodiment, the parameter of the selective epitaxial growth process for forming the body layer 252 further includes a temperature range of 600° C. to 700° C., a pressure range of 100 Torr to 600 Torr, and the gases used for forming the body layer 252 further include the hydrogen chloride gas and the hydrogen gas.

By selecting the process parameter, that is, selecting the temperature range, pressure range, and the gases used, the body layer 252 can be formed and the material characteristics and morphology of the formed body layer 252 can be controlled more accurately.

In an example embodiment, a thickness D of the seed layer 251 ranges from 2 nanometers to 8 nanometers along the direction of the inner wall surface of the opening 240.

In an example embodiment, a maximum width W of the source-drain doped layer 250 is 45 nanometers in a direction perpendicular to an extending direction of each fin 210.

In an example embodiment, a maximum height H of the source-drain doped layer 250 is 60 nanometers.

Correspondingly, a semiconductor structure formed by the above manufacturing method according to an example embodiment of the present disclosure is also provided. As shown in FIGS. 7 and 8, the semiconductor structure includes a substrate including a base 200 and a plurality of separate fins 210 over the base 200 and configured with openings 240 (as shown in FIG. 6), and a source-drain doped layer 250 located in the opening 240. The source-drain doped layer 250 includes a seed layer 251 on a surface of an inner wall of the opening 240 and a body layer 252 on a surface of the seed layer 251. A material of the fins 210 includes a first atom. A material of the seed layer 251 includes the first atom, a second atom, and a third atom. A material of the body layer 252 includes the first atom and the second atom.

In an example embodiment, a material of the substrate 200 includes a semiconductor material.

In an example embodiment, the material of the substrate 200 is silicon. Correspondingly, a material of the fins 210 includes a first atom. The first atom includes a silicon atom.

In some embodiments, the material of the substrate includes silicon carbide, silicon germanium, a multi-element semiconductor material composed of group III-V elements, silicon-on-insulator (SOI), or germanium-on-insulator (GOI), etc. The multi-element semiconductor material composed of group III-V elements includes InP, GaAs, GaP, InAs, InSb, InGaAs, or InGaAsP.

The second atom is used to increase the stress formed by the grown material. The third atom is used to change the growth characteristics of the material. Thus, when the material is grown, according to the selected type of the third atom, the material may have a relatively slow growth rate at the crystal planes in some specific directions or the crystal planes approaching some directions, to enable the structure of the material to have a fixed crystal plane or approach to have a fixed crystal plane.

In an example embodiment, a concentration percentage of the third atom in the seed layer 251 is less than a concentration percentage of the first atom in the seed layer 251 and is less than the concentration percentage of the second atom in the seed layer 251.

In an example embodiment, a concentration percentage of the second atom in the body layer 252 is greater than the concentration percentage of the second atom in the seed layer 251.

In an example embodiment, the second atom includes a phosphorus atom.

In an example embodiment, the third atom includes a germanium atom.

In an example embodiment, the source-drain doped layer 250 is used to form an N-type MOS device.

In some embodiments, another type of the first atom, the second atom, or the third atom can also be selected, to enable the source-drain doped layer to be used to form a P-type MOS device.

In an example embodiment, a concentration percentage of the germanium atoms in the seed layer 251 ranges from 5% to 10%.

In an example embodiment, the semiconductor structure further includes a gate structure 230 (as shown in FIG. 5) on the surface of the substrate. The gate structure 230 across the plurality of fins 210. The openings 240 are located in each fin 210 on both sides of the gate structure 230.

In an example embodiment, the semiconductor structure further includes an isolation layer 220 on the surface of the substrate 200. The isolation layer 220 is located between the substrate 200 and the gate structure 230.

In an example embodiment, a thickness D of the seed layer 251 ranges from 2 nanometers to 8 nanometers along the direction of the inner wall surface of the opening 240.

In an example embodiment, a maximum width W of the source-drain doped layer 250 is 45 nanometers in a direction perpendicular to an extending direction of each fin 210.

In an example embodiment, a maximum height H of the source-drain doped layer 250 is 60 nanometers.

Other embodiments of the disclosure will be apparent to those skilled in the art from consideration of the specification and practice of the embodiments disclosed herein. It is intended that the specification and examples be considered as example only and not to limit the scope of the disclosure, with a true scope and spirit of the invention being indicated by the following claims.

What is claimed is:

1. A semiconductor structure comprising:
   a substrate, including a base and a plurality of fins discretely formed over the base, wherein each fin is made of a material including a first atom and contains openings therein; and
   a source-drain doped layer, located in each opening and including a seed layer on a surface of an inner wall of the opening and a body layer on a surface of the seed layer, a material of the seed layer including the first atom, a second atom, and a third atom, and a material of the body layer including the first atom and the second atom but not including the third atom, the third atom including a germanium atom;
   wherein a concentration percentage of the germanium atom respect to a total amount of atoms of the source-drain doped layer ranges from 5% to 10%.

2. The semiconductor structure of claim 1, wherein the first atom includes a silicon atom, and the second atom includes a phosphorus atom.

3. The semiconductor structure of claim 1, wherein a concentration percentage of the third atom in the seed layer is less than a concentration percentage of the first atom in the seed layer, and is less than a concentration percentage of the second atom in the seed layer.

4. The semiconductor structure of claim 3, wherein a concentration percentage of the second atom in the body layer is greater than the concentration percentage of the second atom in the seed layer.

5. The semiconductor structure of claim 1, wherein a thickness of the seed layer ranges from 2 nanometers to 8 nanometers from the surface of the inner wall of the opening.

6. The semiconductor structure of claim 1, wherein a maximum width of the source-drain doped layer is 45 nanometers in a direction perpendicular to an extending direction of the plurality of fins.

7. The semiconductor structure of claim 1, wherein a maximum height of the source-drain doped layer is 60 nanometers, the maximum height of the source-drain doped layer being a vertical distance from a bottom of the source-drain doped layer to a top of source-drain doped layer.

8. The semiconductor structure of claim 1, further comprising:
   a gate structure, located over a surface of the substrate, across the plurality of fins, wherein the openings are located in each fin on both sides of the gate structure.

9. A manufacturing method for a semiconductor structure comprising:
   providing a substrate, the substrate including a base and a plurality of fins discretely formed over the base, wherein each fin is made of a material including a first atom;
   forming openings in each fin of the plurality of fins; and
   forming a source-drain doped layer in each opening using an epitaxial growth process, the source-drain doped layer including a seed layer on a surface of an inner wall of the opening and a body layer on a surface of the seed layer, a material of the seed layer including the first atom, a second atom, and a third atom, and a material of the body layer including the first atom and the second atom but not including the third atom, the third atom including a germanium atomi wherein a concentration percentage of the germanium atom respect to a total amount of atoms of the source-drain doped layer ranges from 5% to 10%.

10. The manufacturing method of claim 9, wherein the first atom includes a silicon atom, and the second atom includes a phosphorus atom.

11. The manufacturing method of claim 9, wherein the seed layer is formed using a selective epitaxial growth process, and a parameter of the selective epitaxial growth process for forming the seed layer includes:
    gases used for forming the seed layer include a silicon source gas, a phosphorus source gas, and a germanium source gas.

12. The manufacturing method of claim 11, wherein the parameter of the selective epitaxial growth process for forming the seed layer further includes:
    a temperature range of 650° C. to 750° C.;
    a pressure range of 100 Torr to 300 Ton; and
    the gases used for forming the seed layer further include a hydrogen chloride gas and a hydrogen gas.

13. The manufacturing method of claim 11, wherein the body layer is formed using the selective epitaxial growth process, and a parameter of the selective epitaxial growth process for forming the body layer includes:
    gases used for forming the body layer include the phosphorus source gas and the silicon source gas.

14. The manufacturing method of claim 13, wherein the parameter of the selective epitaxial growth process for forming the body layer further includes:

a temperature range of 600° C. to 700° C.;

a pressure range of 100 Torr to 600 Ton; and the gases used for forming the body layer further include the hydrogen chloride gas and the hydrogen gas.

15. The manufacturing method of claim 9, wherein a concentration percentage of the third atom in the seed layer is less than a concentration percentage of the first atom in the seed layer, and is less than a concentration percentage of the second atom in the seed layer.

16. The manufacturing method of claim 15, wherein a concentration percentage of the second atom in the body layer is greater than the concentration percentage of the second atom in the seed layer.

17. The manufacturing method of claim 9, further comprising, before forming the openings:

forming a gate structure across the plurality of fins over a surface of the substrate;

wherein forming the openings includes:

after forming the gate structure, using the gate structure as a mask and etching the plurality of fins on both sides of the gate structure until the openings are formed in the plurality of fins on both sides of the gate structure.

\* \* \* \* \*